United States Patent
Maffeis

(10) Patent No.: US 8,353,547 B2
(45) Date of Patent: Jan. 15, 2013

(54) EQUIPMENT FOR THE SIMULTANEOUS MANIPULATION OF SEVERAL COMPONENTS

(75) Inventor: Giuseppe Maffeis, Roncadelle (IT)

(73) Assignee: GIMATIC S.p.A., Brescia (IT)

( * ) Notice: Subject to any disclaimer, the term of this patent is extended or adjusted under 35 U.S.C. 154(b) by 0 days.

(21) Appl. No.: 13/361,070

(22) Filed: Jan. 30, 2012

(65) Prior Publication Data

US 2012/0200100 A1   Aug. 9, 2012

(30) Foreign Application Priority Data

Feb. 4, 2011 (IT) .............................. BS2011A0011

(51) Int. Cl.
*B66C 1/42* (2006.01)
(52) U.S. Cl. ......................................... 294/87.1; 294/65
(58) Field of Classification Search ................. 294/87.1, 294/65, 81.1, 81.6, 907, 86.4, 183, 184; 414/416.02
See application file for complete search history.

(56) References Cited

U.S. PATENT DOCUMENTS

| | | | | |
|---|---|---|---|---|
| 4,744,595 | A * | 5/1988 | Tonning et al. ................. | 294/65 |
| 5,290,134 | A * | 3/1994 | Baba ............................. | 414/404 |
| 6,439,631 | B1 * | 8/2002 | Kress .............................. | 294/65 |
| 7,023,197 | B2 * | 4/2006 | Jung ......................... | 324/757.01 |
| 7,690,706 | B2 * | 4/2010 | Wild et al. ...................... | 294/65 |
| 7,850,217 | B2 * | 12/2010 | Lo .................................... | 294/65 |
| 8,038,191 | B2 * | 10/2011 | Shim et al. ...................... | 294/65 |
| 2007/0018468 | A1 * | 1/2007 | Behringer .................... | 294/87.1 |
| 2008/0000203 | A1 | 1/2008 | Gilmore et al. | |
| 2009/0053018 | A1 | 2/2009 | Lee | |

FOREIGN PATENT DOCUMENTS

DE   20 2007 013673 U1   2/2009
EP    2 177 307 A1        4/2010

* cited by examiner

*Primary Examiner* — Saul Rodriguez
*Assistant Examiner* — Gabriela Puig
(74) *Attorney, Agent, or Firm* — McGlew and Tuttle, P.C.

(57) ABSTRACT

An equipment (1) for the simultaneous handling of several components having a plurality of gripping heads (2) which are movable between a close position and at least one spaced position in which they are at a preset distance from each other, and vice versa, including a first rod-shaped element (3) to which the gripping heads (2) are slidingly combined, a second rod-shaped element (4) parallel to the first rod-shaped element (3), provided with a longitudinal guide (5), movable between a first position and at least a second position, a plurality of rods (6) hinged in a zigzag forming a broken line (7) having a median fulcrum (8) at which it becomes integral with the second rod-shaped element (4), and a plurality of lateral fulcrums (9) free to slide in the guide (5) of the second rod-shaped element (4).

11 Claims, 8 Drawing Sheets

EQUIPMENT FOR THE SIMULTANEOUS MANIPULATION OF SEVERAL COMPONENTS

FIELD OF THE INVENTION

In its most general aspect the present invention concerns the field of automated handling and it refers in particular to an equipment for the simultaneous handling of several components or various parts to be transferred, positioned, assembled or tested.

Especially, the invention refers to an equipment of the afore said type comprising a plurality of gripping and handling heads for various components and elements, in particular, but not exclusively, having little dimensions such as, for example, electronic devices, semiconductors, mechanical parts and so on.

STATE OF THE ART

As known, in the automatic handling field (automation), there is the need for having equipments able to assure movements and positioning more and more quick and accurate.

The afore said need is felt particularly, for example, in the industry of electronic devices where a great amount of components with little dimensions have to be handled, assembled and tested.

To satisfy this need, the known art provided a lot of automatic equipments for gripping and handling simultaneously a plurality of components with small sizes, such as for example that one described in document US 2009/053018. Devices having cam control means or fan guide systems to handle the gripping means are also available on the market.

Even though advantageous, these equipments are not free from drawbacks among which a structural and functional complexity and a considerable bulk are pointed out, which limit the possibility of being used with appreciable convenience in article or device production with high-density of close devices.

The technical problem based on the present invention is then to provide an equipment for handling simultaneously a plurality of components having a reduced bulk, then being able to allow the pick up, transfer and laying of a plurality of the se components even very close one another, and then resulting at the same time structurally and operatively simplified, accurate and quick in movements, as well as robust and reliable during use.

SUMMARY OF THE INVENTION

The afore said problem is solved, according to the invention, by an equipment for the simultaneous handling of several components or various parts, having a plurality of gripping heads movable between a close position, in which they are moved closer tightly, and at least one spaced position, in which they are at a preset distance from each other, and further comprising: a first rod-shaped element to which said gripping heads are slidingly combined; a second rod-shaped element positioned on a plane parallel to the first rod-shaped element, defining a longitudinal guide, movable between a first position in which it is in a first preset distance from the first rod-shaped element which corresponds to said close position, and at least a second position in which it is at a second distance, shorter than said first preset distance, from the first rod-shaped element, to which corresponds said at least one spaced position of said gripping heads; a plurality of rods hinged in a zigzag forming a broken line with a median fulcrum by means of which it becomes integral with said rod-shaped element, a first order of lateral fulcrums free to slide in said guide of said second rod-shaped element, to which each of said rods is constrained free to rotate and a second order of fulcrums each carrying a gripping head, and control means connected to said second movable rod-shaped element to move the gripping heads through said broken line along the first rod-shaped element between said closed and spaced positions.

Advantageously, the aforesaid control means may be electromechanical or pneumatic. In both cases, the afore said control means comprise at least one movable member fixed to the second rod-shaped element and at least one supporting column fixed to the first rod-shaped element with which the afore said at least one movable device is slidingly coupled.

Preferably, the afore said supporting column is directed towards the displacement direction of the afore said second rod-shaped element with respect to the first rod-shaped element.

Preferably, two movable members fixed to the second rod-shaped element are provided, assembled on two respective supporting columns fixed to the first rod-shaped element disposed at parts opposite to the plurality of handling heads.

Further, the equipment comprises also means for synchronizing the slide of the afore said two movable members on the respective supporting columns for a displacement of the rod-shaped element in parallel with the fixed rod-shaped element.

Where the control means are electromechanical, the afore said movable member is a cursor provided with a pinion rotatably driven by an electric motor, and meshed with a rack toothing obtained along the supporting column the movable member is coupled therewith.

Where the control means are pneumatic, they comprise at least one pneumatic cylinder fed by a fluid under pressure and the supporting column has a piston-shaped portion with a sealing gasket operating in said cylinder.

Advantageously, for its use the afore said equipment may be applied to every handling arm, device or robot and it may be used combined with a similar equipment, the two equipments being positioned face to face with the gripping heads of an equipment staggered compared with the gripping heads of the other equipment.

BRIEF DESCRIPTION OF THE DRAWINGS

Further characteristics and advantages of the present invention will be more evident from the following description of some examples of preferred embodiments, made with reference to the attached drawings for illustration purposes and without limitation, in which.

DETAILED DESCRIPTION OF THE INVENTION

Figure 1:
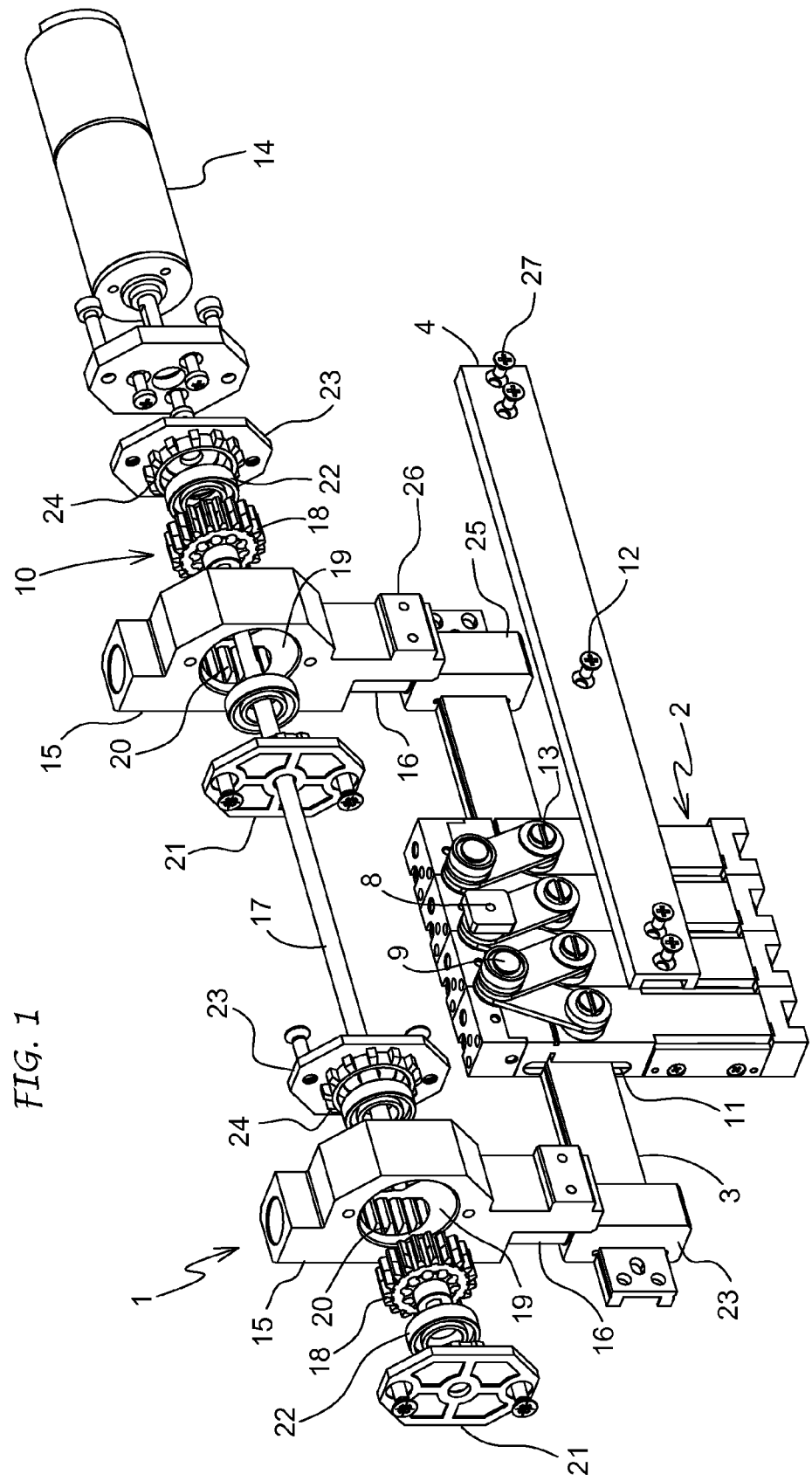
FIG. 1 shows a perspective and partially exploded view of an equipment for simultaneously handling a plurality of components according to a first embodiment of the invention.
Figure 2:
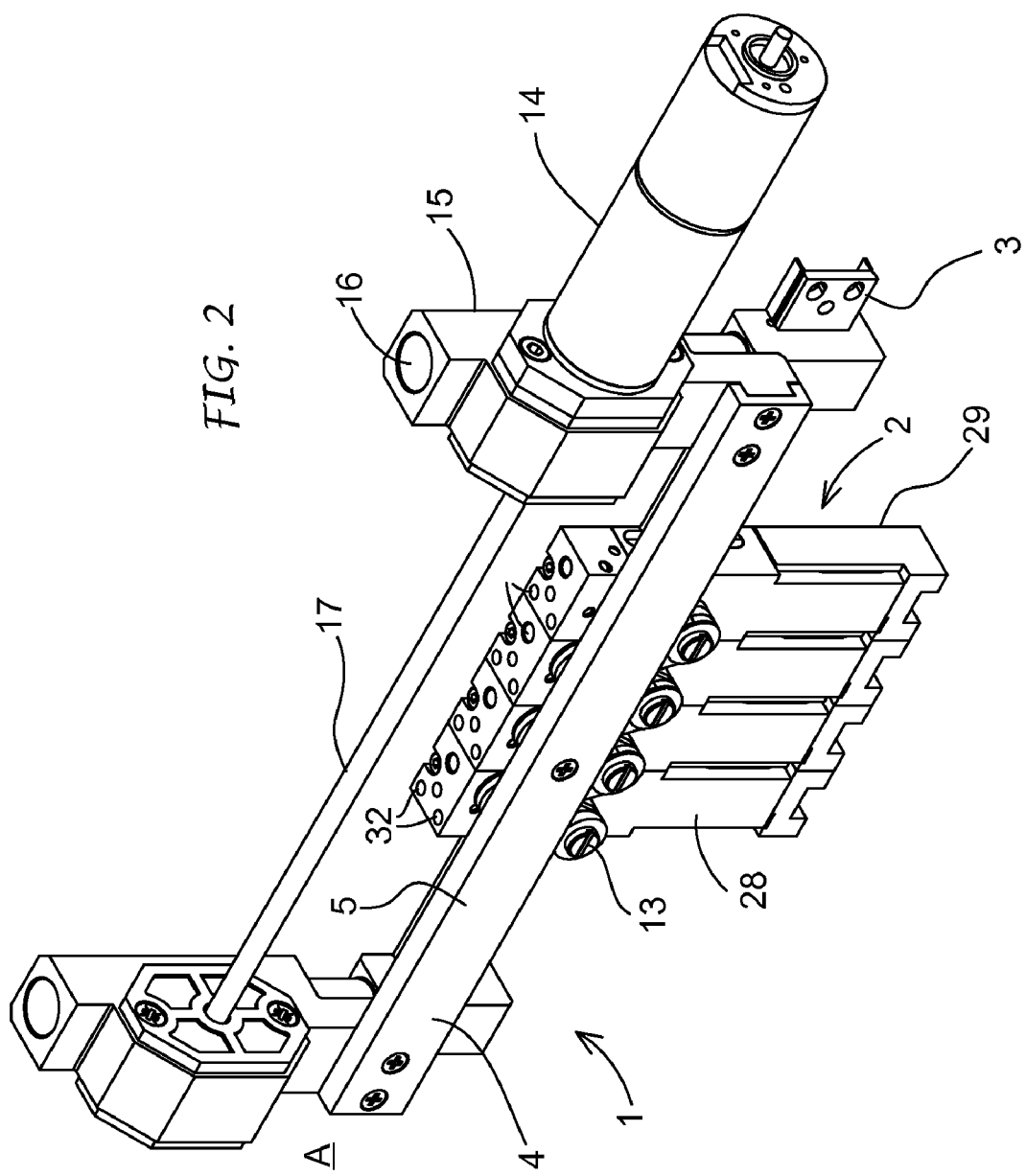
FIG. 2 shows a perspective view of the equipment of FIG. 1 with a plurality of gripping heads in a close position.

Referring to FIGS. 1-6, an equipment according to the invention for handling several components and various parts is generally indicated with the numeral 1. It comprises a plurality of gripping and handling heads 2, being four in the represented example but which may be of different number, adapted to pick-up, transfer, release, assemble, test a respective plurality of components—not represented—, or any way adapted to carry out specific operations.

Particularly, the gripping heads 2 are placed side by side in parallel and they are movable between a close position, i.e. a position in which the handling heads are moved closer tightly, and a spaced position in which they are at a present distance from each other, and vice versa.

Further the gripping heads 2 may also adopt intermediate positions between the afore said two extreme positions, as will be more evident later.

According to the invention, the equipment 1 further comprises: a first rod-shaped element 3, or bar, the gripping heads 2 being slidingly combined therewith; a second rod-shaped element 4, or bar, positioned in a plane in parallel to the first rod-shaped element 3, provided with a longitudinal guide 5 and movable in parallel to itself between a first position A (FIGS. 2 and 3) in which it is at a first preset distance from the first rod-shaped element 3 and a second position B (FIG. 4) in which it is at a different distance, specifically shorter than the afore said first preset distance; a plurality of rods 6 hinged one another in a zigzag to form a broken line 7 in the shape of consecutively aligned semi-parallelograms. In particular, this broken line has a median fulcrum 8 at which it becomes integral with the second rod-shaped element 4 and a plurality of lateral fulcrums 9 free to slide in the guide 5 of said second rod-shaped element 4, to which each rod 6 is constrained, free to rotate. At a respective end portion opposite to that having a fulcrum in 9, each rod 6 carries a gripping head 2.

Control means 10 are connected as well to the second rod-shaped element 4 for its displacement relatively to the first rod-shaped element 3 so that to cause, through the rods 6 of the broken line 7, the displacements of the gripping heads 2 between close and spaced positions.

In detail, to carry out the sliding combining of the gripping heads 2 to the first rod-shaped element 3, each of these heads 2 is provided at the front with a guide groove 11 engaging and running along the profile of the rod-shaped element 3.

Figure 3:
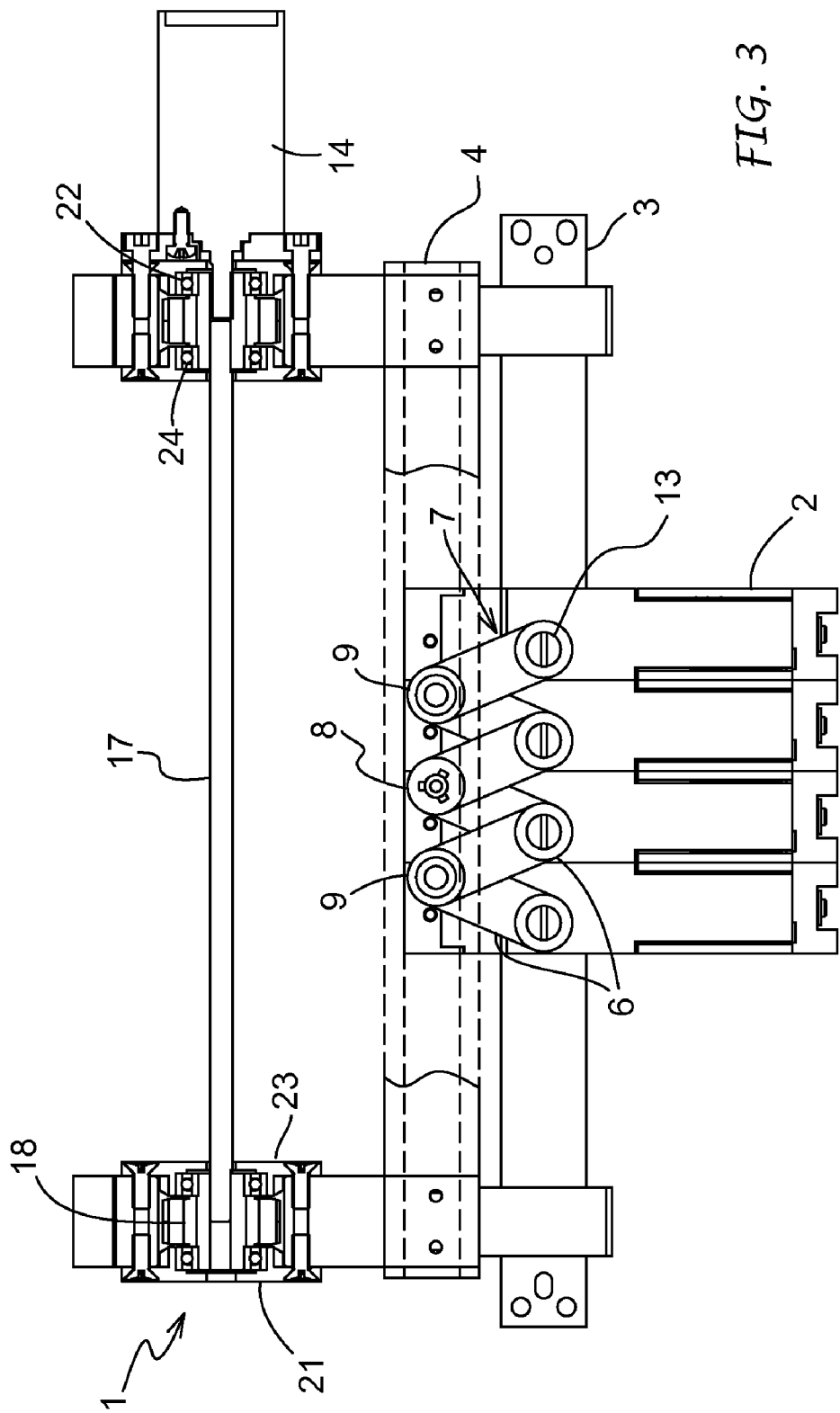
FIG. 3 shows a front and partially sectioned view of the equipment of FIG. 2.
Figure 4:
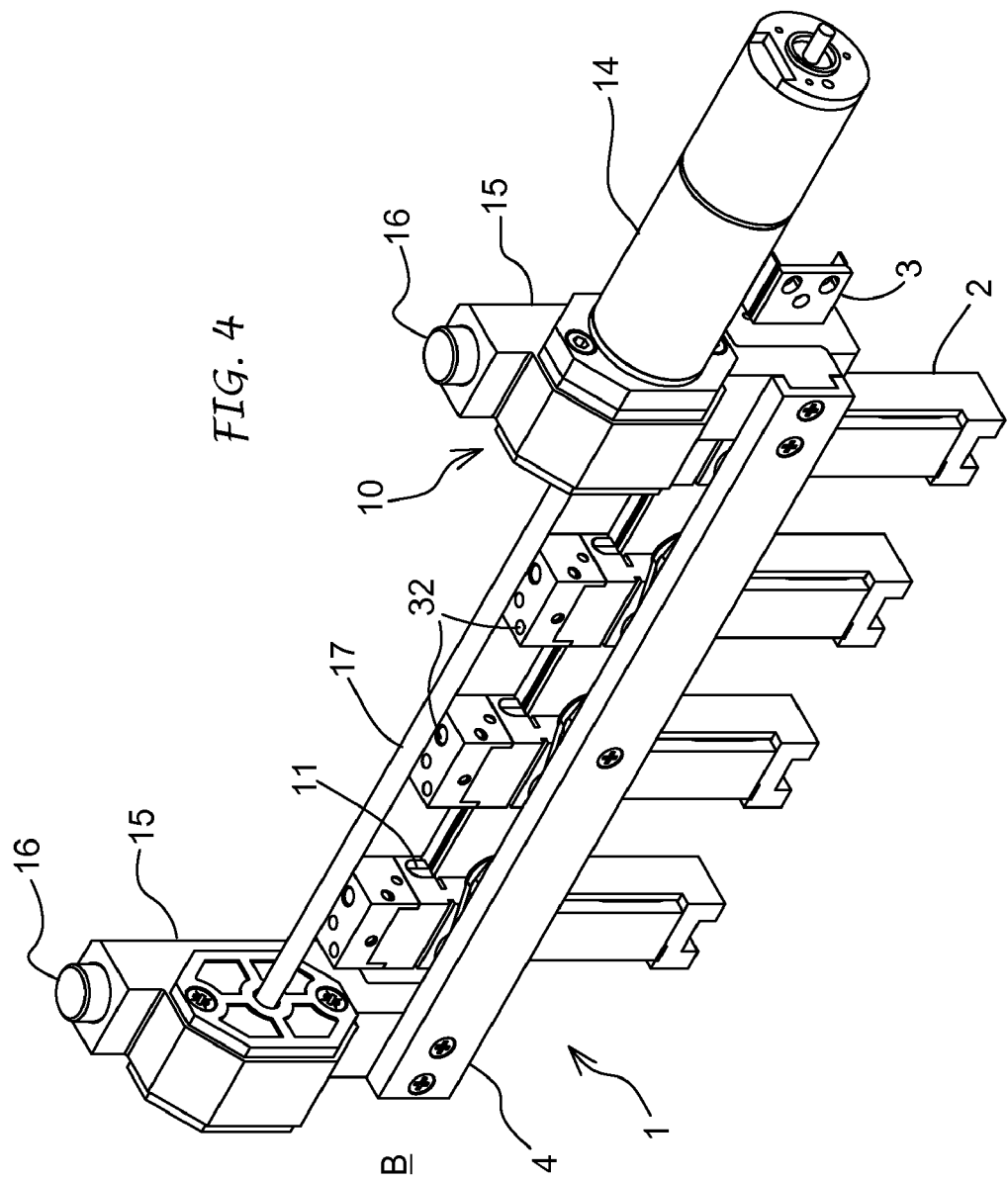
FIG. 4 shows a perspective view of the equipment of FIG. 1 with the plurality of gripping heads in a spaced position.
Figure 5:
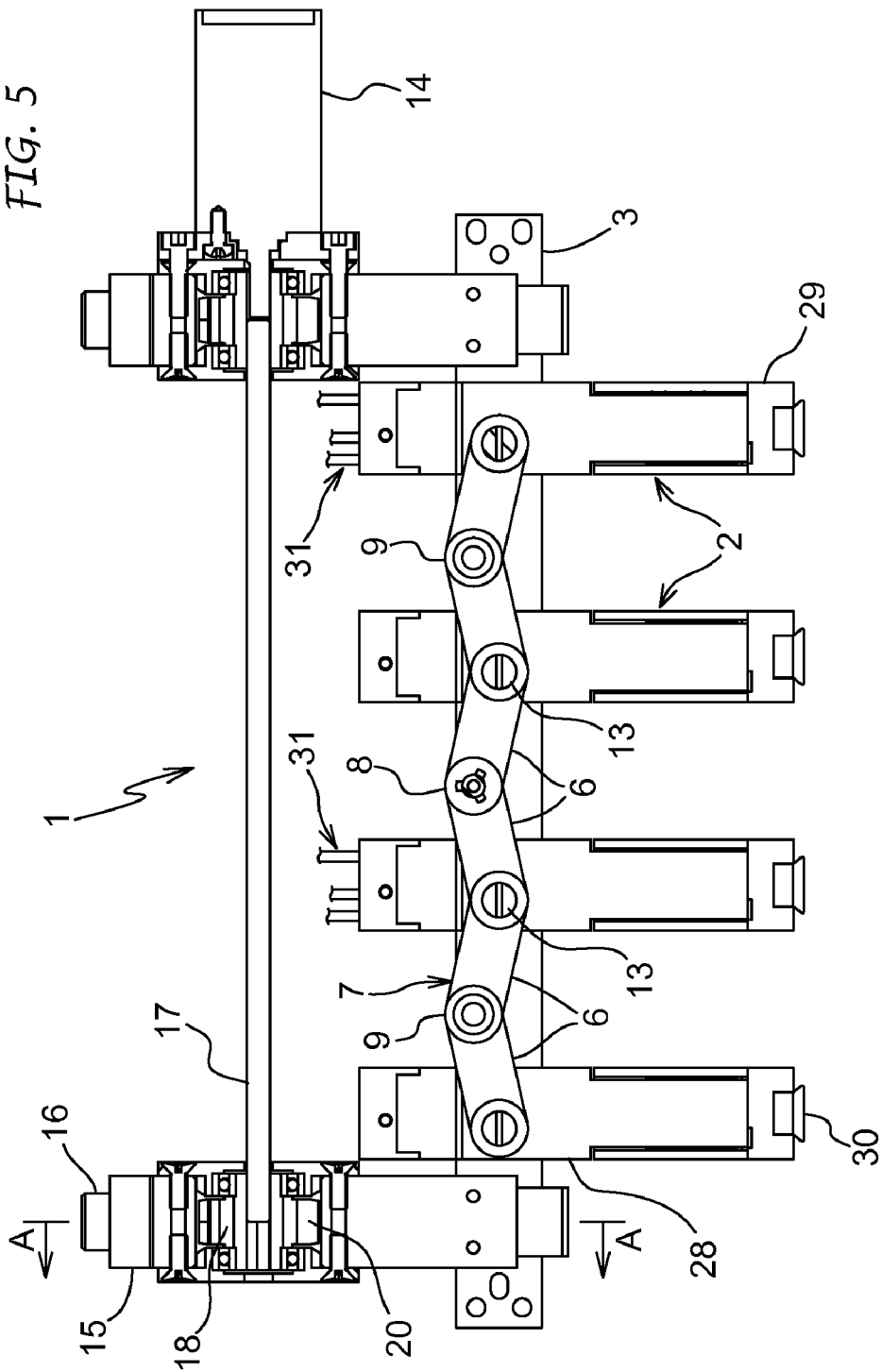
FIG. 5 shows a front and partially sectioned view of the equipment of FIG. 1 without the movable rod-shaped element.

Referring to the second rod-shaped element 4, being movable in parallel with and away from the first rod-shaped element 3, it has to be said that the afore said first position A corresponds to the close position of the gripping heads 2 (FIGS. 2 and 3), whereas the afore said second position B corresponds to the spaced position of the gripping heads 2 (FIGS. 4 and 5).

Further, the second rod-shaped element 4 may adopt intermediate positions between the first and the second position A, B, which correspond to intermediate positions of the gripping heads 2, for a selection of their center-to-center when they are spaced one another starting from their close position.

The correspondence between the afore said position is obtained, according to the invention, by the broken line 7 combining the gripping head 2 to the second movable rod-shaped element 4.

In this regard, the equipment 1 comprises designed combining means 12, 27, in the illustrated example composed of a fixing screw, constraining the median fulcrum 8 of the broken line 7 to the second rod-shaped element 4, and designed pivot means 13, in the illustrated example in the shape of screwed pegs or pins, for constraining each head 2 of a respective rod 6 to the end thereof opposite to the end associated with the second rod-shaped element by the fulcrums 9.

Further, the fulcrums 9 of the broken line 7, from opposite parts of the median fulcrum 8, preferably have rollers or bearings directed in the guide 5 of the second rod-shaped element 4, advantageously provided in the shape of a track with a C-profile.

According to a first embodiment of the invention, the control means 10 comprise essentially an electric motor 14, for example of brushless type, driving a couple of movable members constrained to the ends of the second rod-shaped element 4, in particular a couple of cursors 15 guided along a corresponding couple of supporting columns 16 fixed to the first rod-shaped element 3, oriented in the movement direction of the second rod-shaped element 4 and disposed at opposite parts with respect to the plurality of the gripping heads 2.

In this way the equipment is particularly robust and accurate in movements, however the possibility of providing only one movable member or cursor and only one supporting column not being excluded, respectively fixed to the second and the first rod-shaped element.

In case of two cursors 15, the present equipment further comprises advantageously a synchronizing means to synchronize their movement.

In detail and as explained in FIGS. 1-6, the means synchronizing the movement of cursors 15 is a drive shaft 17, combined with the electric motor 14 and extending between the two cursors.

In particular each cursor 15 is provided with a respective pinion 18 preferably assembled in a housing 19 obtained inside the cursor itself and disposed to mesh with a rack toothing 20 obtained along at least a length of the supporting column 16 extending and facing tangentially to said housing 19.

The housing 19 in each cursor 15 is laterally closed by flanges 21, 23 supporting the respective pinion 18 with the interposition of bearings 22, 24 (FIGS. 1, 3 and 5).

It has to be outlined that by changing conveniently the drive time of the drive motor it will be possible to select and adjust according to requirements the distance between the gripping heads starting from their close position.

The fixing of the supporting columns 16 to the first rod-shaped element 3 and the movable members, i.e. the cursors 15, to the second rod-shaped element 4, is obtained by first connecting means 25 and respectively second connecting means 26.

In the represented example, these first 25 and second 26 connecting means are bracket portions provided at one end of each supporting column 16 and juts provided at one end of each cursor 15 which are fixed respectively at one end of the first rod-shaped element 3 and the second movable rod-shaped element 4.

Referring to the gripping heads 2 it has to be noticed that they are of a known type and then they are not herein described in detail, but illustrated within the limits of useful characteristics for the compression of the invention.

Each gripping head 2 is of the slide type essentially composed of two elements reciprocally coupled and guided, particularly a fixed slide element 28, constrained to the rods 6 and a movable slide element 29 susceptible to reciprocating linear displacements with respect to the fixed slide element, carried out through a control, for example a pneumatic control.

The movable slide element 29 may be provided at a free end with a prehensile member 30, for example a suction cup as schematically shown in FIG. 5, or a clamp or something else.

For the active control of the movable slide element 29 and the prehensile member 30 or other end device combined thereto, respective pneumatic connections 31 are provided, connecting to corresponding passages 32 provided at an end of each head 2 opposite to the end carrying the prehensile member 30.

According to the invention and an alternative embodiment, pneumatic control means are adopted for displacements of the second rod-shaped element. This other embodiment is shown particularly in FIGS. 7-9, wherein parts structurally and operatively similar or equivalent to those of the equipment shown in FIGS. 1-6 are denoted by the same reference numbers.

Figure 9:
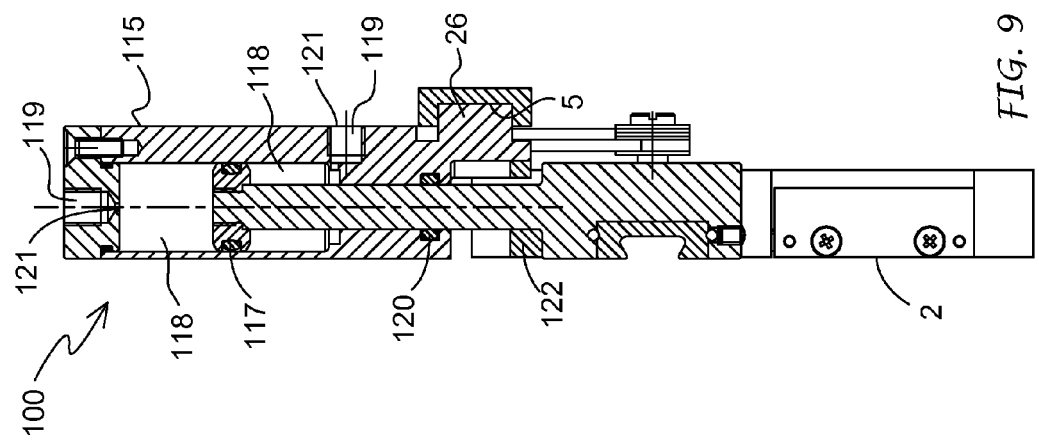
FIG. 9 shows a cross section obtained according to the B-B arrows in FIG. 8.
Figure 6:
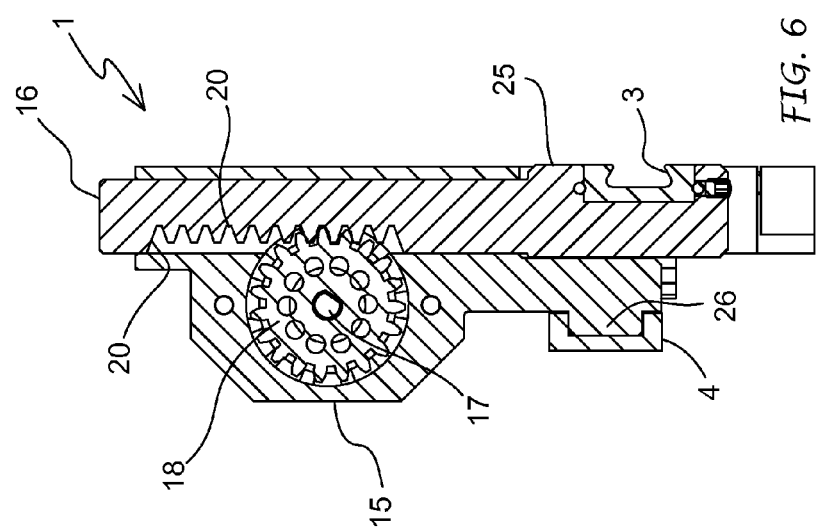
FIG. 6 shows a transversal section of the equipment obtained according to the A-A arrows in FIG. 5.
Figure 7:
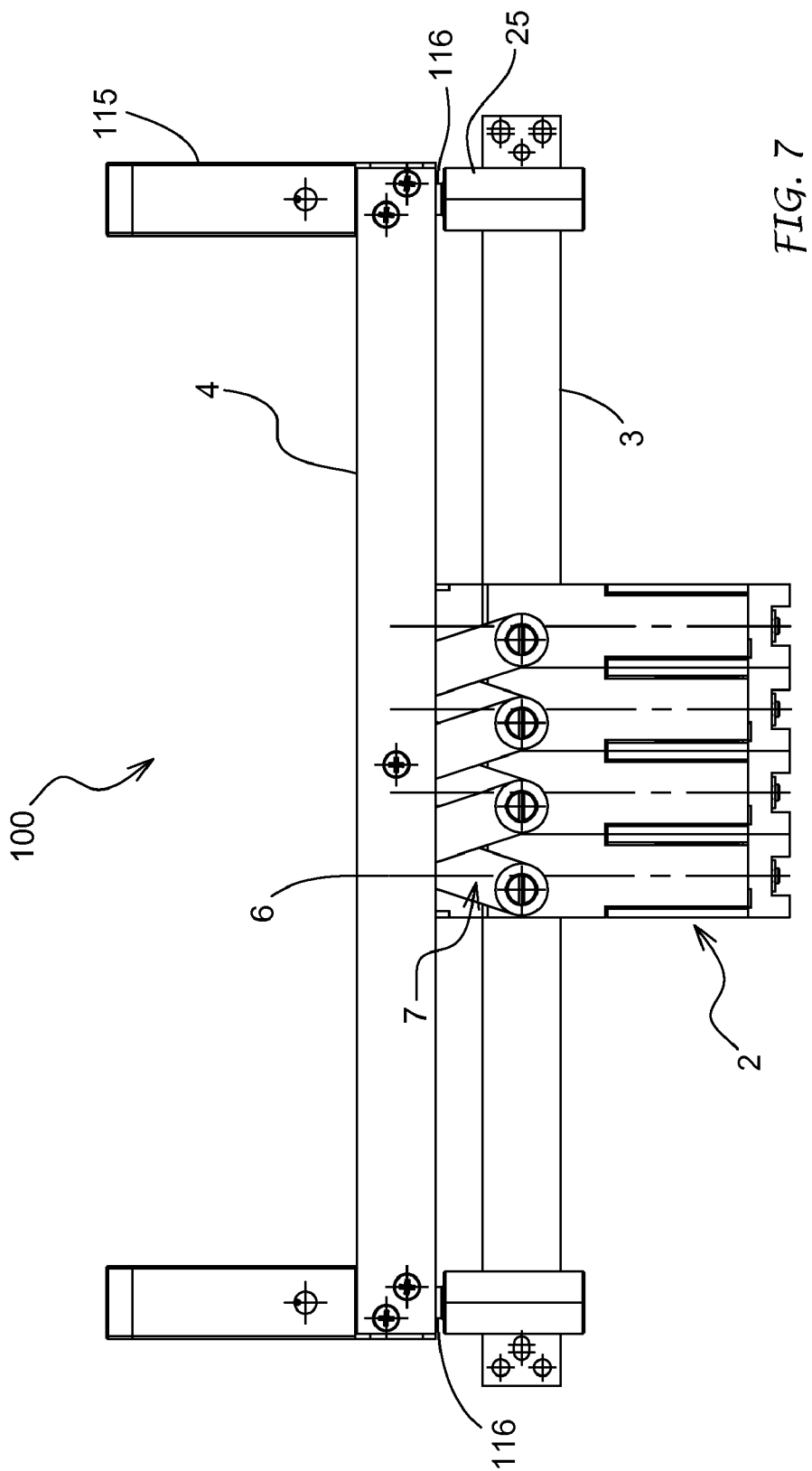
FIG. 7 shows a front view of an equipment for handling simultaneously several components, having a plurality of gripping heads in a close position, according to a variation of the embodiment of the invention.
Figure 8:
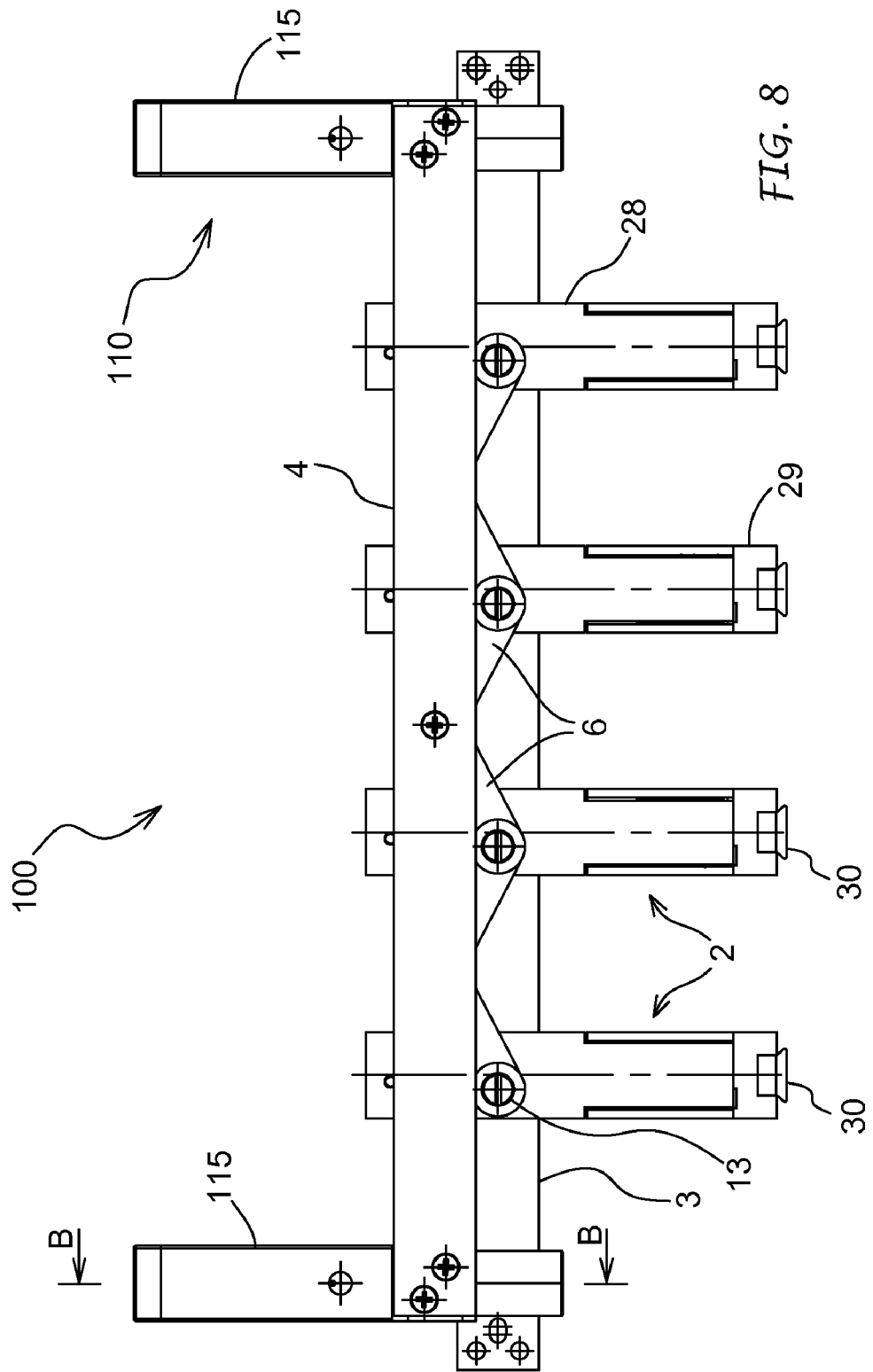
FIG. 8 shows a front view of the equipment of FIG. 7 with the plurality of handling heads in a spaced position.

In FIGS. 7-9, the equipment is indicated totally with the numeral 100 and it is completely similar to the previously illustrated equipment 1 and the description of which is referred to, exactly except the control means indicated altogether with the numeral 110. In particular, these control means 110 comprise then two movable members fixed to the second rod-shaped element 4, specifically consisting of two cylinders 115 both defining a chamber 118.

Similarly to what previously described, each cylinder 115 is combined with a respective supporting column 116, extended in the displacement direction of the second rod-shaped element 4 and fixed to the first rod-shaped element 3. Such a supporting column 116 has a portion with at least one seal gasket 117 housed and operating as a piston inside the chamber 118 of a respective cylinder 115.

Each cylinder 115 is provided with inflow/discharge passages for a fluid, for example pressurized air, indicated with the numeral 119, communicating with the fluid chamber 118 from opposite parts of the piston with the gasket 117 for a reciprocating displacement of the cylinder with respect to the piston and, then, to the respective supporting column 116.

In practice, it is a piston-cylinder coupling where, in the represented case, the movable member, susceptible to reciprocating linear displacements, is the cylinder sliding on the piston integrated in the supporting column 116 according to a preset maximum stroke determined by designed limit stops 120 provided in each supporting column 116.

It has to be noticed that the equipment 100 may comprise designed flow control valves accommodated in the inflow/discharge passages 119 for the adjustments based on continuous positions of the stroke (displacement) of a cylinder 115 along a respective supporting column 116, and then of the second rod-shaped element 4.

The flow control valves, indicated with the numeral 121, may be directed by designed means to synchronize the movement of the two cylinders 115.

To this object, the present equipment may also be managed as an electronic control unit, not illustrated.

The equipment 100 may comprise spacers 122 for the adjustment of the displacement of each cylinder 115, according to discrete positions, with respect to the relative supporting column 116, for example in the shape of washers with different height to be interposed around each supporting column, between the latter and the respective cylinder.

Also in this variation, the equipment is particularly robust and accurate in movements, however the possibility of providing only one movable member, that is specifically only one pneumatic cylinder and only one supporting column, not being excluded, respectively integral with to the second and the first rod-shaped element.

Again, similarly with the equipment described referring to FIGS. 1-6, also the equipment 100 according to FIGS. 7-9 comprises first connecting means 25, which are bracket portions provided in one end of each supporting column 116 and which are fixed to the first rod-shaped element 3, and second connecting means indicated with the numeral 26, which are juts provided in one end of each cylinder 115 and which are fixed in the second rod-shaped element 4.

The advantages of the present invention, already appeared during the afore reported description, may be further pointed out considering the invention provides an equipment for handling simultaneously a plurality of components having a reduced bulk, wherein the thickness of the gripping heads is to be added essentially only to the thickness of two flattened rod-shaped elements and the hinged rods in a zigzag, without front bulky projections.

This aspect is particularly advantageous because it allows to combine and join two equipments according to the invention face to face, in particular but not exclusively, abutting one against the other flush with the first rod-shaped elements supporting the gripping heads. In this way it will be possible to increase the number of active gripping heads and then to handle a greater number of components on a small surface, and advantageously also to halve the pitch between the gripping heads by positioning those of an equipment staggered with respect to those of another equipment.

It has to be noticed that the space portion close to the free end of the fixed slide element of the gripping heads is also substantially clear, and then it is advantageously useful to collect the pneumatic connections to drive the movable slide element, the prehensile member, and other controls if used.

Further, the advantages of a structural and functional simplicity are added to the small whole bulk of the equipment, rendering the invention adapted for use in different automation processes.

The movement of the movable member, cursor or cylinder, driven respectively by the electrical or pneumatic movement means, allows to have an efficient control of the reciprocating displacement of the gripping heads in close or spaced positions, referring both the movement speed, and the movement extent and the precision thereof because it is transmitted by the rods hinged in a zigzag only.

Further, the coupling of the first 3 and second 4 rod-shaped elements by the supporting columns imparts a particular toughness to the whole.

A person skilled of the art will be able to make various changes and variations to the equipment above described in its various embodiments to satisfy contingent and specific requirements, on the other hand all contained in the protection scope of the invention as defined in the following claims.

The invention claimed is:

1. Equipment for the simultaneous handling of several components or various parts, the equipment comprising:
    a plurality of gripping heads movable between a close position, in which the plurality of gripping heads are moved closer tightly, and at least one spaced position, in which said plurality of gripping heads are at a preset distance from each other;
    a first rod-shaped element to which said gripping heads are slidingly combined;

a second rod-shaped element positioned on a plane parallel to the first rod-shaped element, said second rod-shaped element defining a longitudinal guide, movable between a first position in which said longitudinal guide is in a first preset distance from the first rod-shaped element which corresponds to said close position, and at least a second position in which said longitudinal guide is at a second distance, shorter than said first preset distance, from the first rod-shaped element, which corresponds to said at least one spaced position of said gripping heads;

a plurality of rods hinged in a zigzag forming a broken line with a median fulcrum by means of which said broken line becomes integral with said second rod-shaped element, a first order of lateral fulcrums free to slide in said guide of said second rod-shaped element, to which each of said rods is constrained, and a second order of fulcrums, each of said second order of fulcrums carrying a gripping head; and a control means connected to said second movable rod-shaped element for moving said gripping heads through said broken line along the first rod-shaped element between said close position and said spaced position, said gripping heads being placed side by side and guided along the first rod-shaped element and the zigzag rods having said lateral fulcrums conducted along said longitudinal guide defined by the second rod-shaped element.

2. Equipment according to claim 1, wherein said control means is electromechanical.

3. Equipment according to claim 1, wherein said control means is pneumatic.

4. Equipment according to claim 1, wherein said control means comprises at least one movable member fixed to said second rod-shaped element and at least one supporting column fixed to said first rod-shaped element, said movable member being coupled and conducted along said supporting column.

5. Equipment according to claim 4, wherein said at least one supporting column is directed towards a displacement direction of said second rod-shaped element.

6. Equipment according to claim 5, further comprising:
another movable member, said another movable member being fixed to said second rod-shaped element and displaceable along another supporting column fixed to said first rod-shaped element, said at least one supporting column and said another supporting column being disposed at parts opposite to said plurality of gripping heads.

7. Equipment according to claim 4, further comprising:
another movable member, said another movable member being fixed to said second rod-shaped element and displaceable along another supporting column fixed to said first rod-shaped element, said at least one supporting column and said another supporting column being disposed at parts opposite to said plurality of gripping heads.

8. Equipment according to claim 7, further comprising:
a means for synchronizing movement of said another movable member and said at least one movable member.

9. Equipment according to claim 4, wherein said at least one movable member is a cursor provided with a pinion rotatably driven by an electric motor, and said at least one supporting column comprises at least a part having a rack toothing to mesh with said pinion.

10. Equipment according to claim 4, wherein said at least one movable member is a cylinder fed by a fluid under pressure and said at least one supporting column comprises a portion comprising a piston with a gasket operating on said cylinder.

11. Equipment according to claim 1, usable in pairs with an equal equipment, the two equipments being positioned face to face with the gripping heads of one of the two equipments which are staggered compared with the gripping heads of another one of the two equipments.

* * * * *